US010669632B2

(12) United States Patent
Kikuchi et al.

(10) Patent No.: US 10,669,632 B2
(45) Date of Patent: Jun. 2, 2020

(54) PROCESSING APPARATUS

(71) Applicant: TOKYO ELECTRON LIMITED, Tokyo (JP)

(72) Inventors: Masahiro Kikuchi, Oshu (JP); Tsuneyuki Okabe, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 338 days.

(21) Appl. No.: 15/347,289

(22) Filed: Nov. 9, 2016

(65) Prior Publication Data

US 2017/0137942 A1     May 18, 2017

(30) Foreign Application Priority Data

Nov. 13, 2015   (JP) .................................. 2015-222739

(51) Int. Cl.
*C23C 16/40* (2006.01)
*C23C 16/455* (2006.01)
*C23C 16/44* (2006.01)

(52) U.S. Cl.
CPC .... *C23C 16/45578* (2013.01); *C23C 16/4409* (2013.01); *C23C 16/45561* (2013.01)

(58) Field of Classification Search
CPC .......... C23C 16/45578; C23C 16/4409; C23C 16/45561
USPC ........................ 118/715; 156/345.33, 345.34
See application file for complete search history.

(56) References Cited

U.S. PATENT DOCUMENTS

| | | | | |
|---|---|---|---|---|
| 5,318,633 A | * | 6/1994 | Yamamoto | .......... C23C 16/4404 118/725 |
| 5,441,570 A | * | 8/1995 | Hwang | ............... C23C 16/4401 118/715 |
| 5,578,132 A | * | 11/1996 | Yamaga | .............. C23C 16/4404 118/715 |
| 5,777,300 A | * | 7/1998 | Homma | ............ H01L 21/67115 219/679 |
| 5,846,073 A | * | 12/1998 | Weaver | ................... C30B 31/10 432/241 |

(Continued)

FOREIGN PATENT DOCUMENTS

| | | |
|---|---|---|
| JP | 7-29840 A | 1/1995 |
| JP | 7-66145 A | 3/1995 |

(Continued)

*Primary Examiner* — Rudy Zervigon
(74) *Attorney, Agent, or Firm* — Nath, Goldberg & Meyer; Jerald L. Meyer

(57) ABSTRACT

A processing apparatus includes a processing container, a manifold having an injector supporting part, the injector supporting part being disposed at a lower end of the processing container, extending along an inner wall surface in the processing container and having an insertion hole, and a gas introduction part having a gas flow passage within the gas introduction part to communicate with the insertion hole and an outside of the processing container so that a gas flows in the gas flow passage, an injector inserted and fixed into the insertion hole, the injector entirely extending in a linear manner along the wall surface and having an opening communicating with the gas flow passage at a location where the injector is inserted into the insertion hole, and a gas supplying pipe communicating with and connected to an outer end of the gas flow passage of the gas introduction part.

18 Claims, 15 Drawing Sheets

(56) References Cited

U.S. PATENT DOCUMENTS

| | | | | |
|---|---|---|---|---|
| 5,927,762 | A * | 7/1999 | Webb | F16L 39/005 285/123.15 |
| 6,736,636 | B2 * | 5/2004 | Saito | C23C 16/4409 137/590 |
| 8,002,895 | B2 * | 8/2011 | Inoue | C23C 16/45578 118/715 |
| 8,070,880 | B2 * | 12/2011 | Marubayashi | H01L 21/67248 118/719 |
| 8,075,692 | B2 * | 12/2011 | Osborne | C23C 16/24 118/715 |
| 8,343,277 | B2 * | 1/2013 | Takebayashi | C23C 16/4402 118/715 |
| 8,821,656 | B2 * | 9/2014 | Kobayashi | H01L 21/67109 148/559 |
| 9,159,591 | B2 * | 10/2015 | Yang | H01L 21/67017 |
| 9,163,311 | B2 * | 10/2015 | Hasegawa | C23C 16/45578 |
| 2001/0054386 | A1 | 12/2001 | Saito | |
| 2007/0075086 | A1 * | 4/2007 | Honma | C30B 31/10 220/560.13 |
| 2008/0083372 | A1 * | 4/2008 | Inoue | C23C 16/345 118/725 |
| 2008/0190910 | A1 * | 8/2008 | Shimada | H01L 21/67109 219/390 |
| 2009/0016854 | A1 * | 1/2009 | Morohashi | H01L 21/67017 414/161 |
| 2009/0116936 | A1 * | 5/2009 | Marubayashi | H01L 21/67109 414/148 |
| 2009/0205783 | A1 * | 8/2009 | Tanabe | C30B 25/14 156/345.37 |
| 2010/0186667 | A1 | 7/2010 | Ishii et al. | |
| 2010/0212593 | A1 * | 8/2010 | Takebayashi | C23C 16/4402 118/725 |
| 2011/0117729 | A1 * | 5/2011 | Osborne | C23C 16/24 438/478 |
| 2011/0139319 | A1 * | 6/2011 | Kobayashi | H01L 21/324 148/559 |
| 2012/0180727 | A1 * | 7/2012 | Hasegawa | C23C 16/45578 118/730 |
| 2015/0267296 | A1 * | 9/2015 | Nishida | H01L 21/0214 438/787 |
| 2017/0137942 | A1 * | 5/2017 | Kikuchi | C23C 16/45561 |
| 2018/0087152 | A1 * | 3/2018 | Yoshida | C23C 16/402 |
| 2018/0087156 | A1 * | 3/2018 | Fukushima | C23C 16/45587 |
| 2019/0093230 | A1 * | 3/2019 | Fukushima | C23C 16/52 |

FOREIGN PATENT DOCUMENTS

| | | | |
|---|---|---|---|
| JP | 7-115068 | A | 5/1995 |
| JP | 10-98028 | A | 4/1998 |
| JP | 2001-230212 | A | 8/2001 |
| JP | 2007081365 | A * | 3/2007 |
| JP | 2007-258580 | A | 10/2007 |
| JP | 2008-18545 | A | 1/2008 |
| JP | 2009-224765 | A | 10/2009 |
| JP | 2010-93131 | A | 4/2010 |
| JP | 4815352 | B2 | 9/2011 |
| JP | 4929199 | B2 | 2/2012 |
| JP | 2014-56959 | A | 3/2014 |
| JP | 2014-152833 | A | 8/2014 |
| JP | 2015-151574 | A | 8/2015 |
| KR | 10-1998-0011807 | A | 4/1998 |
| KR | 10-2013-0079710 | A | 7/2013 |

* cited by examiner

PROCESSING APPARATUS

CROSS-REFERENCE TO RELATED APPLICATION

This application claims the benefit of Japanese Patent Application No. 2015-222739, filed on Nov. 13, 2015, in the Japan Patent Office, the disclosure of which is incorporated herein in its entirety by reference.

TECHNICAL FIELD

The present disclosure relates to a processing apparatus.

BACKGROUND

Conventionally, there has been known a heat treatment apparatus having a gas pipe connecting structure for connecting a plurality of gas pipes to a predetermined gas introduction part of a processing container in order to introduce a plurality of kinds of gases into the processing container.

For example, in the conventional heat treatment apparatus, a gas introduction passage is formed in a sidewall of the processing container, and a horizontal portion of an L-shaped injector made of quartz is inserted into a portion of the gas introduction passage on the side of the processing container. Further, connection structures that can establish a connection by means of a thread-engaging mechanism similar to a bolt and a nut are provided at an outer peripheral surface of a flange and a leading end of a gas pipe, and an O-ring is also provided at an outside of the gas introduction passage, so that when the gas pipe is connected to the flange by the aforementioned thread-engaging mechanism, the gas can be hermetically introduced from the gas pipe into the processing container.

In the gas pipe connection structure described above, since it was necessary to install the O-ring and the thread-engaging mechanism similar to the bolt and the nut, some extent of space was required at a place where the gas pipe is connected. Moreover, since the horizontal portion of the L-shaped injector made of quartz was inserted into and fixed to the gas introduction passage, it was necessary to thicken the horizontal portion of the injector in order to secure a predetermined strength. As such, in the gas pipe connection structure, from the viewpoint of the connection structure employing the thread-engaging mechanism and the securement of the strength of the injector, it was difficult to reduce a pitch between injectors so that there was a limitation on the number of the injectors to be installed, for example, an upper limit of the number of the injectors was about nine.

Meanwhile, in a film deposition process using a recent vertical type heat treatment apparatus, it is required to uniformly perform the film deposition processing over a plurality of substrates stacked in a vertical direction, in an up and down direction of the substrates, and thus, there is a need for an apparatus enabling a process of individually supply a gas to each of areas arranged in the vertical direction. In this process, there is a need for installation of an injector for each of the areas and a plurality of injectors needs to be used in a process for one lot of substrates.

SUMMARY

Some embodiments of the present disclosure provides a processing apparatus having a simple structure and a small pitch between injectors to enable installation of injectors of which the number is approximately two times or greater as compared with a conventional processing apparatus.

According to one embodiment of the present disclosure, there is provided a processing apparatus, including a processing container; a manifold having an injector supporting part, the injector supporting part being disposed at a lower end of the processing container, extending along an inner wall surface in the processing container and having an insertion hole into which a tubular member can be inserted and fitted from outside and by which the tubular member can be supported, and a gas introduction part protruding from the injector supporting part and having a gas flow passage within the gas introduction part to communicate with the insertion hole and an outside of the processing container so that a gas flows in the gas flow passage; an injector inserted and fixed into the insertion hole, the injector entirely extending in a linear manner along the wall surface and having an opening communicating with the gas flow passage at a location where the injector is inserted into the insertion hole; and a gas supplying pipe communicating with and connected to an outer end of the gas flow passage of the gas introduction part.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 8A to 8C are views illustrating one example of a method of installing an injector in the injector supporting part shown in FIG. 7, wherein FIG. 8A is a view showing one example of an injector inserting process, FIG. 8B is a view showing one example of an injector fixing process, and FIG. 8C is a view showing one example of an installation completion state of an injector.

FIGS. 9A to 9C are views showing a method of installing an injector to a conventional gas introduction part in a comparative example, wherein FIG. 9A is a view showing a process of installing the injector to a gas introduction passage 196, FIG. 9B is a view showing a gas pipe connecting process, and FIG. 9C is a view showing an injector installation completion state of a conventional gas introduction member in the comparative example.

FIGS. 15A and 15B are views illustrating one example of an installation state of a heater at the gas introduction part of the manifold of the processing apparatus according to the embodiment of the present disclosure, wherein FIG. 15A is an overall perspective view of one example of the installation state of the heater at the gas introduction part and FIG. 15B is a partial enlarged view of one example of the installation state of the heater at the gas introduction part.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
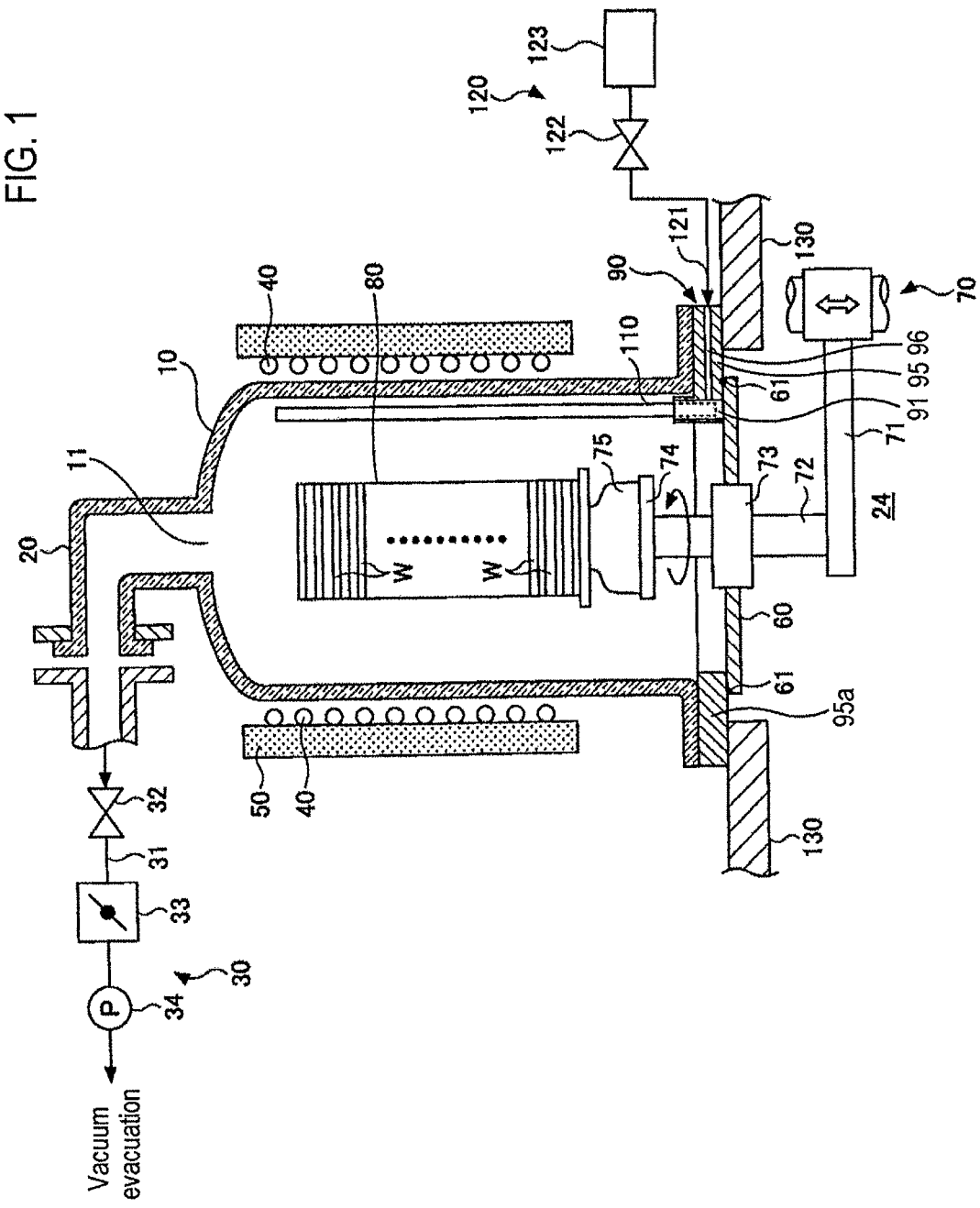
FIG. 1 is a view illustrating one example of a processing apparatus according to an embodiment of the present disclosure.

FIG. 1 is a view showing one example of a processing apparatus according to an embodiment of the present disclosure. The processing apparatus according to the embodiment of the present disclosure is not particularly limited in view of an object to be processed and a processing operation, but is applicable to various processing apparatuses for performing processing by supplying a gas into a processing container. In this embodiment, a processing apparatus for performing heat treatment on a substrate will be described by way of example. Accordingly, FIG. 1 illustrates a configuration of a vertical type heat treatment apparatus.

In FIG. 1, the heat treatment apparatus has a processing container 10 for containing semiconductor wafers W. The processing container 10 is formed of quartz having high thermal resistance to have a generally cylindrical shape and has an evacuation opening 11 in a ceiling thereof. The processing container 10 is configured in a vertical type extending in a vertical direction. If the diameter of the wafer W to be processed is 300 mm, for example, the processing container 10 is set to have a diameter ranging from 350 mm to 450 mm.

A gas evacuation port 20 is connected to the evacuation opening 11 formed in the ceiling of the processing container 10. The gas evacuation port 20 is composed of, for example, a quartz pipe that extends from the evacuation opening 11 and is then bent at a right angle to extend in a horizontal direction, showing an L-shape.

A vacuum evacuation system 30 is connected to the gas evacuation port 20 for evacuating an atmosphere in the processing container 10. Specifically, the vacuum evacuation system 30 has a metallic gas evacuation pipe 31 made of, for example, stainless steel and connected to the gas evacuation port 20. Moreover, an opening/closing valve 32, a pressure-regulating valve 33 such as a butterfly valve and a vacuum pump 34 are sequentially disposed at intermediate portions of the gas evacuation pipe 31 to enable the atmosphere in the processing container 10 to be pressure-regulated and evacuated to a vacuum state. Furthermore, an inner diameter of the gas evacuation port 20 is set to be equal to that of the gas evacuation pipe 31.

A heating means 40 is installed at a side of the processing container 10 to surround the processing container, and can heat the semiconductor wafers W loaded within the processing container. Moreover, an insulating material 50 is provided on an outer peripheral surface of the heating means 40 to secure thermal stability.

A lower end of the processing container 10 made of quartz is opened to enable the wafers W to be carried in and out. The processing container 10 is configured such that an opening of the lower end is opened or closed by a lid 60.

A wafer boat 80 is provided above the lid 60. The wafer boat 80 is a wafer holding member for holing the wafers W and is configured to hold the plurality of wafers W in a state where they are spaced apart from each other in a vertical direction. The number of the wafers held by the wafer boat 80 is not particularly limited, and, for example, 50 to 100 wafers W are held on the wafer boat 80.

The wafer boat 80 is mounted on a table 74 with a heat-insulating tube 75 made of quartz interposed therebetween, and the table 74 is supported on an upper end of a rotational shaft 72 penetrating the lid 60 for opening/closing the opening formed at the lower end of the processing container 10. Then, for example, a magnetic fluid seal 73 is provided at a penetrating portion of the rotational shaft 72 to allow the rotational shaft 72 to be hermetically sealed and rotatably supported. In addition, a seal member 61 formed of, for example, O-ring is provided at a periphery of the lid 60 and the lower end of the processing container 10, thereby keeping sealability of the processing container 10.

The rotational shaft 72 is provided at a leading end of an arm 71 supported at an elevation device 70, for example, such as a boat elevator to enable the wafer boat 80 and the lid 60 to be integrally lifted or lowered. Furthermore, the table 74 may be fixedly installed at the lid 60 to perform the processing of the wafers W without rotating the wafer boat 80.

A manifold 90 is disposed at the lower end of the processing container 10, wherein the manifold has a portion extending along an inner peripheral wall of the processing container 10 and a flange-shaped portion extending outwardly in a radial direction. Moreover, a desired gas is introduced from the lower end of the processing container 10 into the processing container 10 via the manifold 90. The manifold 90 is configured as a component independent from the processing container 10, but is installed integrally with the sidewall of the processing container 10 to constitute a portion of the sidewall of the processing container 10. A detailed configuration of the manifold 90 will be described later.

The manifold 90 supports an injector 110. The injector 110 is a gas supplying means for supplying a gas into the processing container 10 and is generally made of quartz. The injector 110 is provided to extend in an up and down direction within the processing container 10 and supplies the gas directly to the wafers W.

In general, a plurality of injectors 110 is provided depending on the kind of gas. Currently, since there may be a case where an injector 110 is individually installed at each of the regions in a vertical direction in the wafer boat 80 at which the wafers are stacked, it may be necessary to install ten or more injectors 110. The processing apparatus according to the embodiment of the present disclosure has a configuration enabling installation of the plurality of injectors 110. The details of this configuration will be described later.

A gas supplying system 120 is provided to supply the gas to the injectors 110. The gas supplying system 120 has gas pipes 121 that are made of metal, for example, stainless steel and communicate with the injectors 110. A flow rate controller 123 such as a mass flow controller and an opening/closing valve 122 are sequentially installed at intermediate portions of the gas pipe 121 to supply the process gas while controlling the flow rate thereof. Another processing gas necessary for the substrate processing is also supplied through the manifold 90 and the gas supplying system 120 constructed as such.

A periphery of the manifold 90 at the lower end of the processing container 10 is supported by a base plate 130 formed of, for example, stainless steel, and this base plate 130 supports the weight of the processing container 10. A portion below the base plate 130 is formed as a wafer carrying chamber having a wafer moving and loading device, and this wafer transfer chamber has a nitrogen gas atmosphere with approximately atmospheric pressure. In addition, a portion above the base plate 130 has a clean air atmosphere as in a conventional clean room.

Next, the configuration of the manifold 90 of the processing apparatus according to the embodiment of the present disclosure will be described in more detail.

Figure 2:
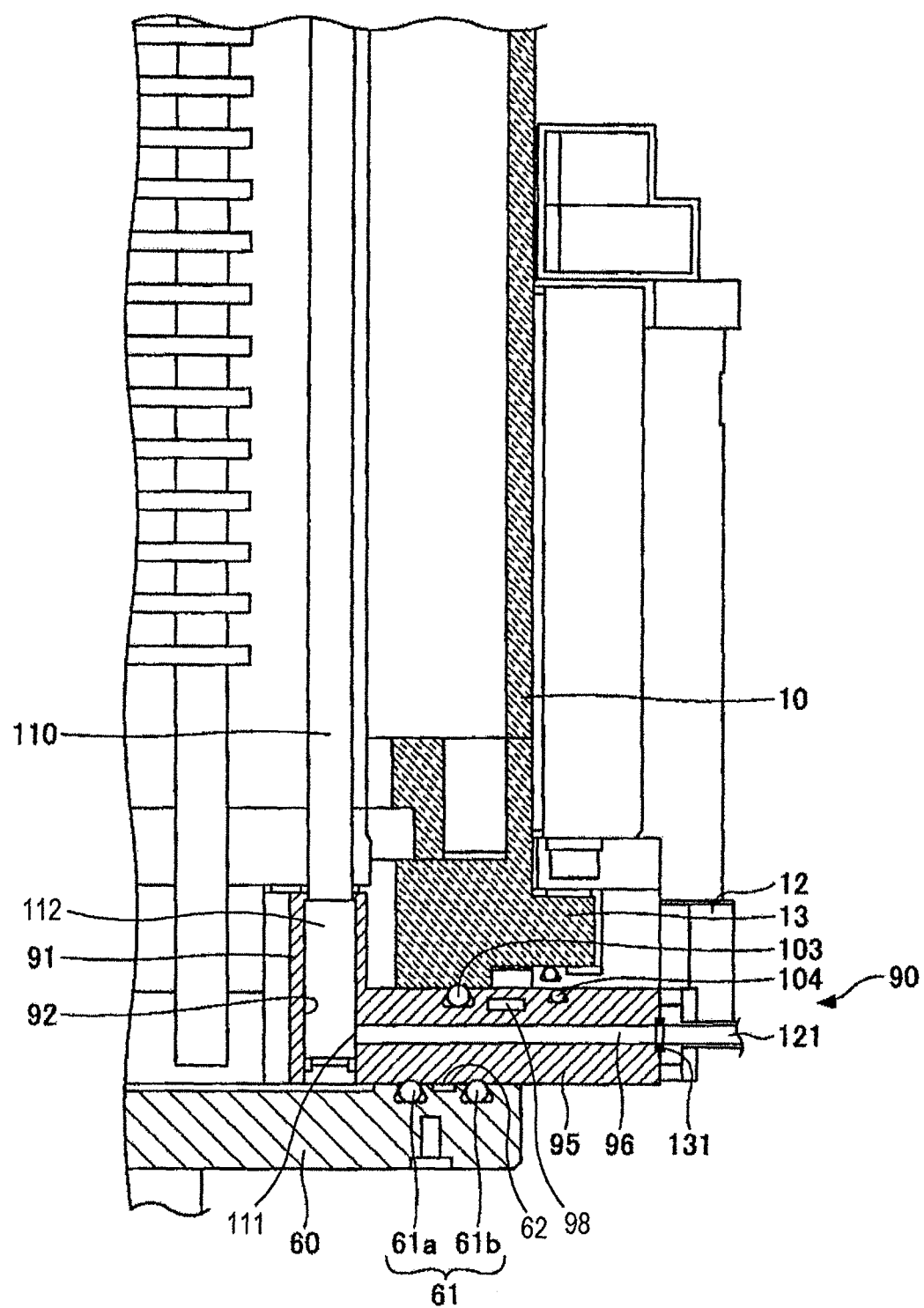
FIG. 2 is a view illustrating one example of a sectional configuration of a manifold of the processing apparatus according to the embodiment of the present disclosure.

FIG. 2 is a view illustrating one example of a sectional configuration of the manifold 90 of the processing apparatus according to the embodiment of the present disclosure. The manifold 90 has an injector supporting part 91, a gas introduction part 95, and a frame-shaped part 95a. The injector supporting part 91 is a part extending along an inner wall surface of the processing container 10 in a vertical direction and supports the injector 110. The injector supporting part 91 has an insertion hole 92 into which a lower end of the injector 110 can be inserted, wherein the lower end of the injector 110 can be supportedly fitted thereinto from an outside. The gas introduction part 95 is a part extending radially outward from the injector supporting part 91 and exposed outside the processing container 10, and has a gas introducing passage (gas flow passage) 96.

The gas pipe 121 is connected to an outer end of the gas introducing passage 96 to allow the gas to be supplied from the outside. The gas pipe 121 can be connected to the gas introducing passage 96 via a gasket 131 and may be connected to the gas introducing passage 96 without using a thread engaging mechanism using a bolt and a nut. Further, in FIG. 2, a gasket holding groove concentric with the gas introducing passage 96 is formed at a periphery of the outer end of the gas introducing passage 96 and a leading end of the gas pipe, and the gasket 131 is configured to be placed into this holding groove to establish hermetical sealing.

The manifold 90 is installed to be inserted between a bottom flange 12 and a flange 13 constituting the lower end of the processing container 10 and the lid 60. The lid 60 is moved in the up and down direction when the processing container 10 is opened/closed. As shown in FIG. 2, in a state where the lid 60 is closed, the manifold 90 is inserted between lower surfaces of the bottom flange 12 and the flange 13 constituting the lower end of the processing container 10 and an upper surface of the lid 60.

Moreover, as shown in FIG. 2, dual seal members (O-rings) 61a and 61b may be provided between the contact surfaces of the upper surface of the lid 60 and the lower surface of the manifold 90, if necessary. The details thereof will be described later.

In general, the manifold 90 is made of metal. It is desirable that the processing container 10 and components constituting the processing container 10 are basically made of quartz from the point of view of prevention of metal contamination. However, places which have a complicated shape or a thread engaging connection such as a screw or the like may not be made of metal. The manifold 90 of the processing apparatus according to the embodiment of the present disclosure is made of metal. The injector 110 does not have an L-shape but has a linear rod shape. The horizontally extending gas introducing passage 96 is formed in the gas introduction part 95 of the manifold 90, and an opening 111 communicating with the gas introducing passage 96 is formed in the injector 110, thereby eliminating a thick horizontal portion from the injector 110. As such, since the gas introduction part 95 of the manifold 90 does not need to receive such a thick horizontal portion of the injector 110, it is possible to decrease the thickness and height of the gas introduction part 95 of the manifold 90 so as to reduce the metal contamination.

Moreover, the metal constructing the manifold 90 may be a metal having corrosion resistance, such as stainless steel, aluminum and hastelloy.

Figure 3:
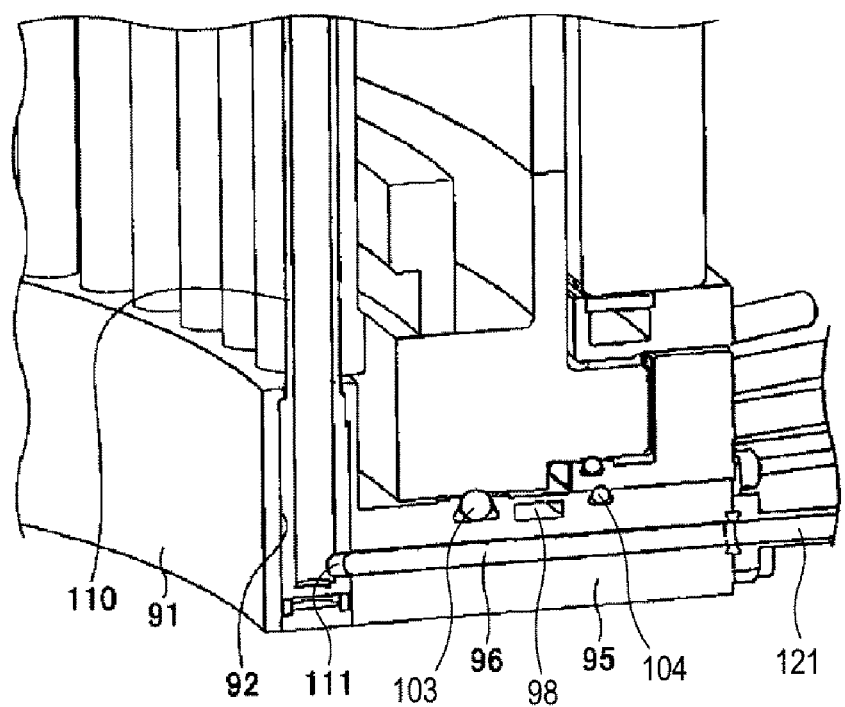
FIG. 3 is a sectional perspective view of the manifold of the processing apparatus according to the embodiment of the present disclosure.

FIG. 3 is a sectional perspective view of the manifold 90 of the processing apparatus according to the embodiment of the present disclosure.

As shown in FIG. 3, the injector supporting part 91 extends along the inner peripheral wall of the processing container 10 and a plurality of insertion holes 92 are circumferentially disposed in the injector supporting part to enable a plurality of injectors 110 to be supported. Each of the insertion holes 92 has a height enabling the injector 110 to be supported in an upright standing posture when one of the injectors 110 is inserted into the insertion hole. The opening 111 is formed in a side surface of the injector 110 and is configured to be in communication with the gas introducing passage 96 of the gas introduction part 95.

Further, an inner peripheral surface of the manifold 90 may be configured to be covered with a quartz cover so as to be protected from a corrosive gas.

Furthermore, the lid 60 described with reference to FIGS. 1 and 2 may be made of quartz, and all of things inside the processing container 10 may be made of quartz.

Moreover, since it is sufficient that the gas introduction part 95 has the gas introducing passage 96 through which the gas can flow, and there is no need for the gas introduction part 95 to allow the injector 110 to extend therethrough. Accordingly, the gas introduction part 95 can be constructed to have a minimum thickness, whereby the height of the gas introduction part 95 becomes smaller than that of the injector supporting part 91. For example, the gas introduction part 95 may be configured to have a height of 20 to 30 mm.

Figure 4:
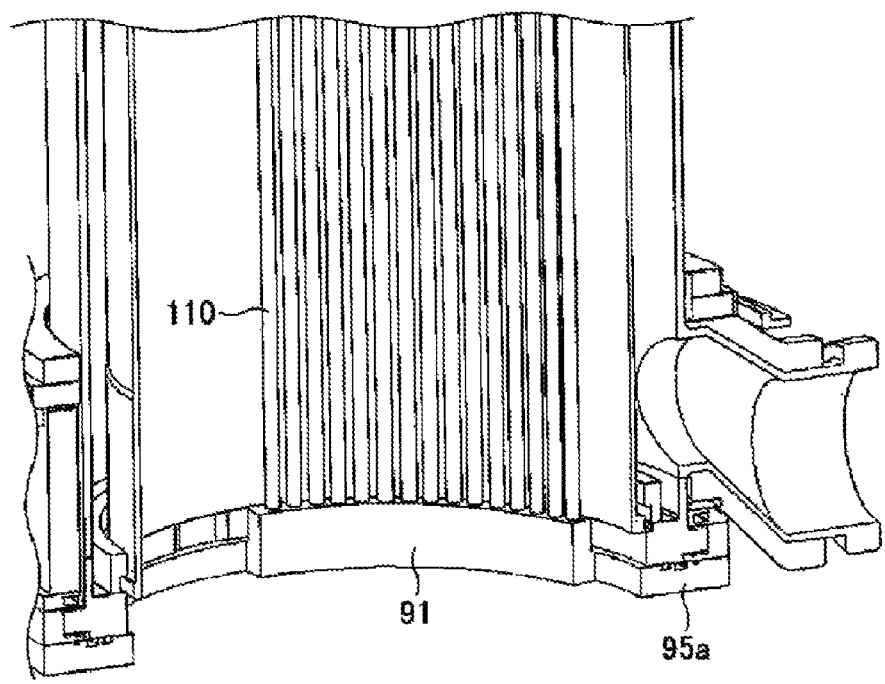
FIG. 4 is a perspective view of the manifold of the processing apparatus according to the embodiment of the present disclosure, when viewed from the center of a processing container.

FIG. 4 is a perspective view of the manifold 90 of the processing apparatus according to the embodiment of the present disclosure, when viewed from the center of the processing container 10. As shown in FIG. 4, the plurality of injectors 110 is supportedly arranged by the injector supporting part 91. As shown in FIG. 4, the injector supporting part 91 is formed at a place where the injector 110 needs to be installed, but the injector supporting part 91 is not installed at a place where installation of the injector 110 is not required. The frame-shaped part 95a, which has an appearance identical to that of the gas introduction part 95 and does not have the gas introducing passage 96 formed therein, is formed at the place where the injector supporting part 91 is not formed. The frame-shaped part 95a may be formed to conform to the side surface or a lower end surface of the processing container 10. For example, if the processing container 10 has a polygonal shape, the frame-shaped part 95a and the gas introduction part 95 as a whole may be formed into a polygonal shape suitable for the processing container 10. In this embodiment, since the processing container 10 has a cylindrical shape, the gas introduction part 95 and the frame-shaped part 95a are formed into a ring shape as a whole. In addition, although FIG. 4 illustrates that an inner peripheral surface of the injector supporting part 91 further protrudes inward than an inner peripheral surface of the frame-shaped part 95a, the present disclosure is not limited thereto, and the inner peripheral surface of the injector supporting part 91 may be configured to be flush with the inner peripheral surface of the frame-shaped part 95a. In this case, a protrusion for avoiding contact with the injector 110 may be formed on the sidewall of the processing container 10, and the injector 110 is then installed to correspond to this protrusion.

Figure 5:
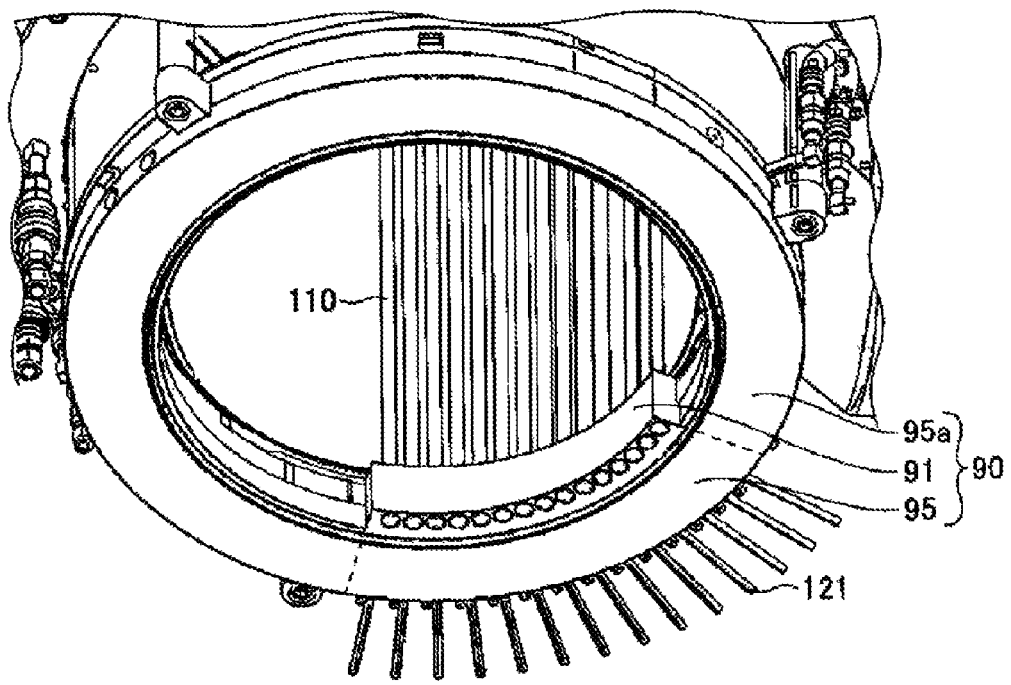
FIG. 5 is a perspective view of the manifold of the processing apparatus according to the embodiment of the present disclosure, when viewed from a bottom face thereof.

FIG. 5 is a perspective view of the manifold 90 of the processing apparatus according to the embodiment of the present disclosure, when viewed from a bottom face thereof. As shown in FIG. 5, the gas introduction part 95 and the frame-shaped part 95a continuously forms a ring shape as a whole.

Figure 6:
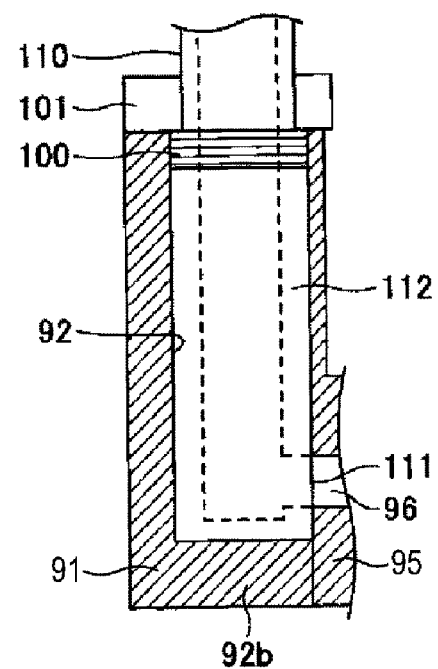
FIG. 6 is a view illustrating one example of an internal configuration of an injector supporting part of the processing apparatus according to the embodiment of the present disclosure.

FIG. 6 is a view illustrating one example of an internal configuration of the injector supporting part 91 of the processing apparatus according to the embodiment of the present disclosure. The injector supporting part 91 is configured such that the insertion hole 92 has a bottom surface 92b and the lower end of the injector 110 is placed on the bottom surface 92b. In this case, the injector 110 is inserted from above the insertion hole 92 and then placed on the bottom surface 92b. Moreover, a spring 100 is provided at an upper portion of the insertion hole 92 to urge a thick portion 112 of the injector 110 from the upper side, and installation of a fixing member 101 above the spring 100 allows the injector 110 to be fixed by a biasing force applied from the upper side of the spring 100. Moreover, when the injector 110 is fixed, the opening 111 of the injector 110 communicates with the gas introducing passage 96 of the gas introduction part 95.

With regard to an order of installation of the injector 110, the injector 110 is inserted into the insertion hole 92 of the injector supporting part 91 of the manifold 90, the spring 100 is fitted around the injector 110 and installed at an upper portion of the insertion hole 92, and the fixing member 101 having an opening is fitted around the injector 110 and secured above the spring 100. The injector 110 is fixed by means of the spring 100, so that even though expansion or contraction is generated in the manifold 90 and the injector 110 due to a difference of thermal expansion and thus a gap may be produced between the insertion hole 92 and the thick portion 112 of the injector 110, the injector 110 can be pressed against the bottom surface 92b by the pressing force of the spring 100, thereby effectively suppressing inclination of the injector 110.

Figure 7:
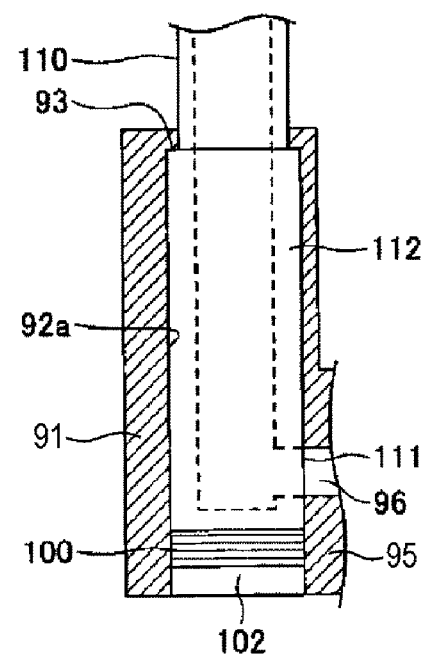
FIG. 7 is a view illustrating one example of an internal configuration, which is different from that of the injector supporting part of the processing apparatus according to the embodiment of the present disclosure shown in FIG. 6.

FIG. 7 is a view illustrating one example of an internal configuration, which is different from that of the injector supporting part 91 of the processing apparatus according to the embodiment of the present disclosure shown in FIG. 6. In the configuration shown in FIG. 7, the insertion hole 92 is formed as a through hole 92a and the injector 110 is configured to be inserted from below the through hole 92a. An upper end of the through hole 92a is provided with a catching portion 93 by which the thick portion 112 of the injector 110 can be caught. In this case, the spring 100 is provided below the injector 110 and a plug 102 (disc member) as a fixing member is installed below the spring. As such, the injector 110 may be configured to be installed from below. In this case, since there is no need for considering an upper space required in the configuration in which the injector 110 is inserted from above as shown in FIG. 6, it is possible to reduce the height of the processing container 10. Further, instead of the spring 100, another elastic member such as an O-ring may be employed. This configuration is identical to the configuration shown in FIG. 6 in that when the injector 110 is fixed, the opening 111 of the injector 110 communicates with the gas introducing passage 96 of the gas introduction part 95. Although FIGS. 6 and 7 show the examples in which only one spring 100 is provided at upper and lower portions of the thick portion 112 of the injector 110, respectively, springs may be provided at both the upper and lower portions.

Figure 8A:
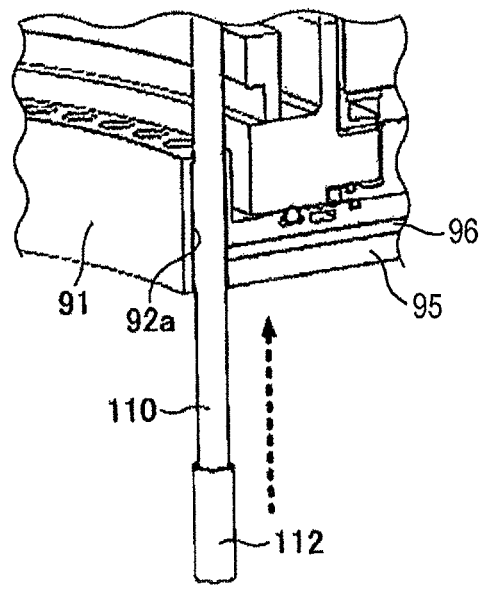
Figure 8B:
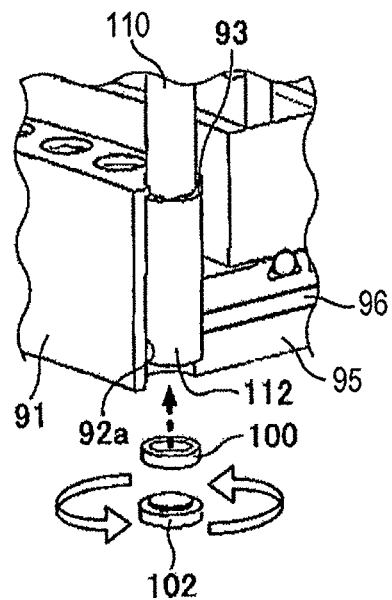
Figure 8C:
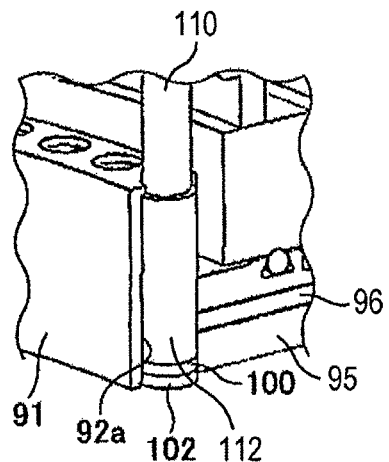

FIGS. 8A to 8C are views illustrating one example of a method of installing the injector 110 in the injector supporting part 91 shown in FIG. 7.

FIG. 8A is a view showing one example of an injector inserting process. In the injector inserting process, the injector 110 is inserted into the through hole 92a of the injector supporting part 91 from below the through hole.

FIG. 8B is a view showing one example of an injector fixing process. In the injector fixing process, the spring 100 and the plug 102 are inserted in this order from below the inserted injector 110 so that the spring 100 and the plug 102 may be secured on the bottom surface of the through hole 92a. Specifically, the catching portion 93 for preventing the thick portion 112 of the injector 110 from escaping upward is provided at the upper portion of the through hole 92a so that the thick portion 112 of the injector 110 is pressed against the catching portion 93 from below by the spring 100 to fix the injector 110. The plug 102 functions as a fixing member for fixing the spring 100 by means of a fixing structure such as a thread engaging mechanism. Moreover, when the injector 110 is fixed, the opening 111 communicates with the gas introducing passage 96 of the gas introduction part 95.

FIG. 8C is a view showing one example of an installation completion state of the injector. When the installation of the injector 110 is completed, the injector 110 is fixed, the spring 100 and the plug 102 are located at the lower end of the insertion hole 92a, and a lower surface of the plug 102 is flushed with a lower surface of the gas introduction part 95.

Figure 9A:
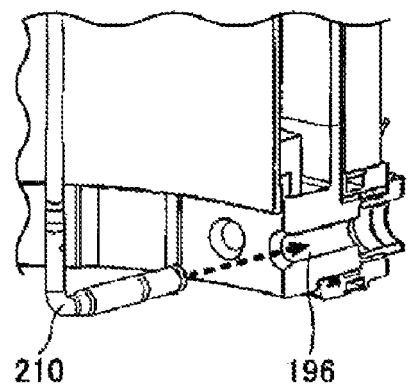
Figure 9B:
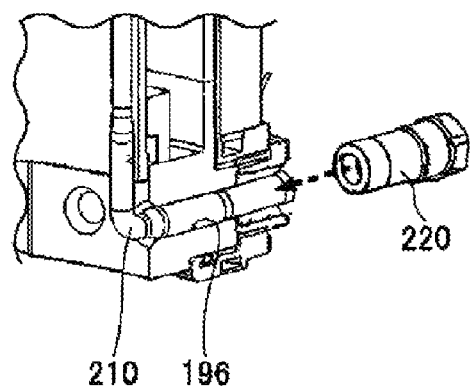
Figure 9C:
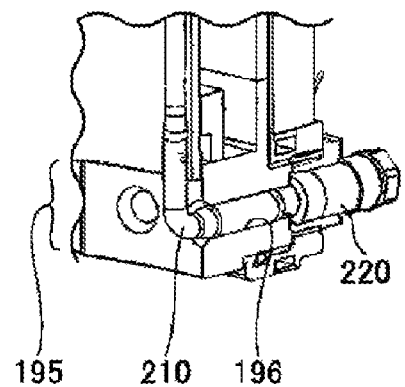

FIGS. 9A to 9C are views showing a method of installing an injector to a conventional gas introduction part in a comparative example. FIG. 9A is a view showing a process of installing an injector 210 to a gas introduction passage 196. As shown in FIG. 9A, the injector 210 is formed into an L shape, wherein a horizontal portion is thicker than a vertical portion. Moreover, the thick horizontal portion is inserted from the interior of the processing container into the gas introducing passage 196.

FIG. 9B is a view showing a gas pipe connecting process. In the gas pipe connecting process, the gas pipe 220 is secured to the gas introducing passage 196 by a thread engaging mechanism provided at the leading end of the gas pipe 220 and an outside of the gas introducing passage 196, respectively, and the injector 210 is then connected to the gas pipe 220.

FIG. 9C is a view showing an injector installation completion state of a conventional gas introduction member in the comparative example. It can be found that since a large space is required for a large thickness of the horizontal portion of the injector 210 and the thread engaging mechanism for connecting the gas introducing passage 196 and the gas pipe 220, resulting in a very large thickness of a gas introduction part 195. In this case, it may be difficult to install a large number of injectors 210.

Moreover, it is very difficult to insert the horizontal portion of the injector 210, which has an elongated portion extending upward in the vertical direction, into the horizontal gas introducing passage 196.

On the contrary, in the manifold 90 of the processing apparatus according to the embodiment of the present disclosure, it is possible to form the gas introduction part 195 so as to have a very small thickness and simultaneously to greatly reduce a pitch between the neighboring injectors 110, thereby reducing metal contamination and enabling installation of the plurality of injectors 110. Furthermore, since there is no horizontal portion, an installation work for the injector 110 can be also extremely easily performed.

Figure 10:
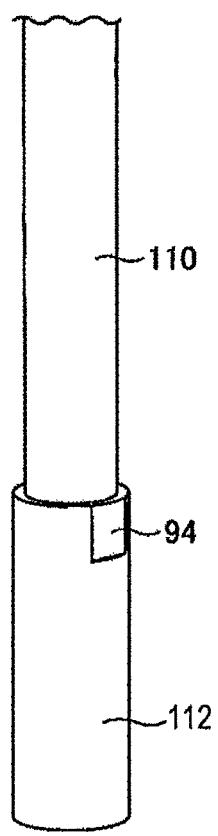
FIG. 10 is a view illustrating one example of a structure for preventing a rotation of the injector.

FIG. 10 is a view illustrating one example of a structure for preventing a rotation of the injector 110. As shown in FIG. 10, the inner peripheral surface of the insertion hole 92 or 92a and the peripheral surface of the injector 110 may be provided with catching structures 94 engaged with each other to prevent the rotation of the injector. Although FIG. 10 illustrates the structure in which D-cut portions are formed in the inner peripheral surface of the insertion hole 92 or 92a and the outer peripheral surface of the injector 110 such that they are engaged with each other, thereby preventing the rotation of the injector 110, a variety of catching structures 94 may be employed so far as they can prevent the rotation of the injector 110.

Figure 11:
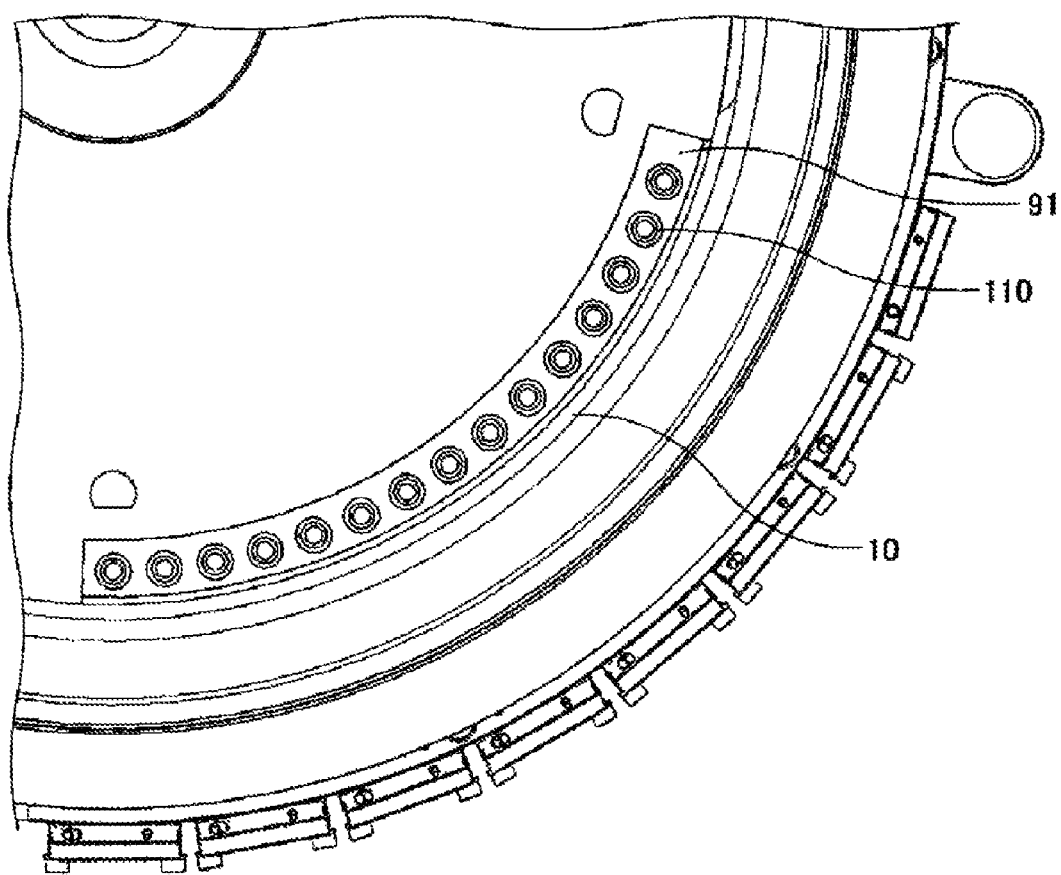
FIG. 11 is a view illustrating an installation example of the injector by means of the manifold of the processing apparatus according to the embodiment of the present disclosure.

FIG. 11 is a view illustrating an installation example of the injector 110 by means of the manifold 90 of the processing apparatus according to the embodiment of the present disclosure. In FIG. 11, the injectors 110 are supported by the circular arc-shaped injector supporting part 91 formed along the inner peripheral wall of the processing container 10. An open angle of the injector supporting part 91 about the center of the processing container 10 is smaller than 90 degrees and greater than 45 degrees, and fifteen injectors 110 are installed in this angle. In the conventional configuration shown in FIG. 10, an upper limit of the number of the injectors 210 to be installed in this angle is eight. Therefore, according to the processing apparatus of the embodiment of the present disclosure, it can be seen that two times or more injectors may be installed within the same area.

Figure 12:
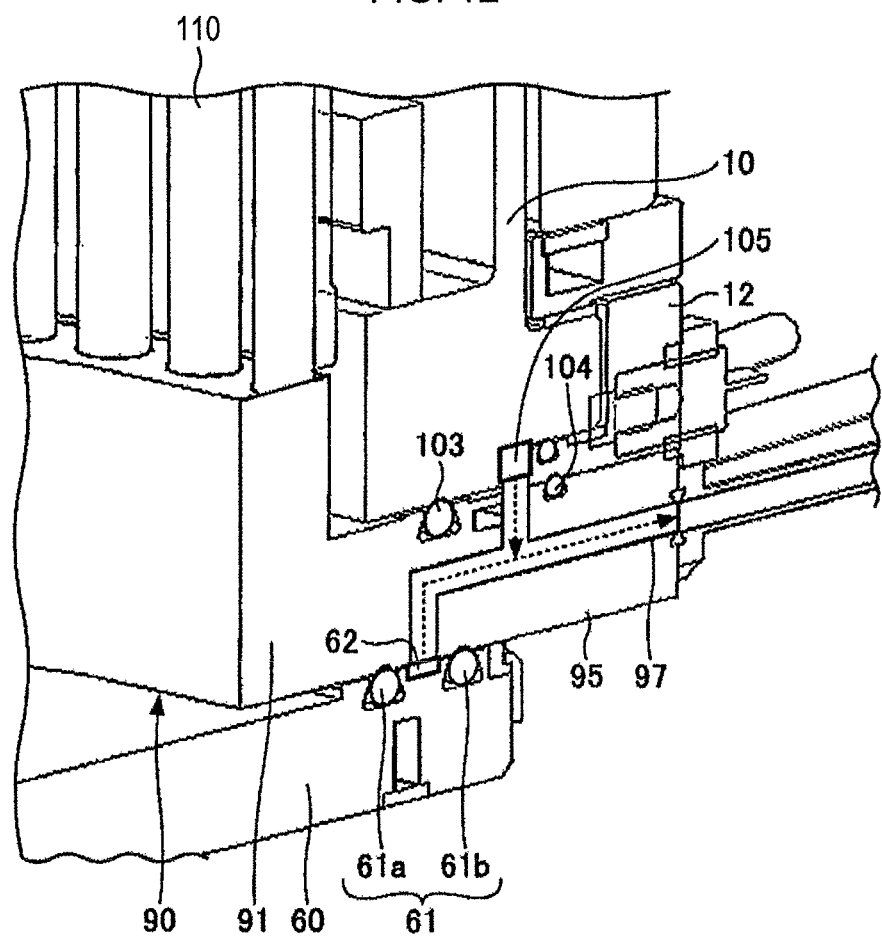
FIG. 12 is a view illustrating one example of a seal structure of the manifold of the processing apparatus according to the embodiment of the present disclosure.

FIG. 12 is a view illustrating one example of a seal structure of the manifold 90 of the processing apparatus according to the embodiment of the present disclosure.

Examples of a seal structure of a contact surface with the lid 60 and a seal structure of a contact surface with the lower end surface of the processing container 10 are illustrated in FIG. 12.

As described above, dual O-rings 61a and 61b forming concentric circles are disposed in the contact surface between the lid 60 and the manifold 90. If necessary, a venting passage 97 may be provided between the dual O-rings 61a and 61b to allow differential pumping to be performed. With this, it is possible to reduce oxygen permeability and leakability of the O-rings 61a and 61b, thereby enhancing sealability.

Moreover, a cut-away portion 62 may be formed between the dual O-rings 61a and 61b to easily carry out vacuum evacuation. Although FIG. 12 shows that the cut-away portion 62 is formed in an upper surface of the lid 60, the cut-away portion may be formed in the lower surface of the manifold 90.

Likewise, dual O-rings 103 and 104 are provided between the processing container 10 and the manifold 90, and a venting passage 97 is formed between the dual O-rings 103 and 104. In the example shown in FIG. 12, at a location where the O-ring 103 the O-ring 104 are provided, the processing container 10 is composed of separate components (a main body and the bottom flange 12 of the processing container 10), so that a space 105 is formed between the components to easily perform evacuation between the dual O-rings 103 and 104. As such, the space 105 such as a cut-away portion may be properly formed between the dual O-rings 103 and 104. In addition, in a case where the space 105 cannot be formed between the components, the space 105 may be formed in the upper surface of the manifold 90.

Furthermore, recesses are formed in the upper surface of the lid 60 to dispose the dual O-rings 61a and 61b therein, and recesses are formed in the upper surface of the manifold 90 to dispose the dual O-rings 103 and 104 therein.

The differential pumping can be performed by connecting a vacuum evacuation means such as a vacuum pump to an outer end of the venting passage 97 and by performing vacuum evacuation. At this time, the vacuum evacuation system 30 described in FIG. 1 may be employed and another vacuum evacuation system may be also utilized.

Moreover, it is desirable that the venting passage 97 is provided within a range in which the venting passage 97 does not interfere with the gas introducing passage 96, so that the venting passage 97 does not affect the gas introduction into the injector 110.

Furthermore, the venting passage 97 may be utilized as a purge gas supplying passage for supplying a purge gas, rather than an evacuation passage. In this case, the venting passage 97 is not connected to the vacuum evacuation means, but is connected to a purge gas supplying source. With this, the contact surface of the manifold 90 and the lid 60 between the dual O-rings 61a and 61b and the contact surface of the manifold 90 and the lower end of the processing container 10 between the dual O-rings 103 and 104 can be purged. Additionally, for example, nitrogen gas may be employed as the purge gas.

An example in which the dual O-rings 61a and 61b are disposed in the contact surface of the lid 60 and the manifold 90 and the dual O-rings 103 and 104 are also disposed in the contact surface of the processing container 10 and the manifold 90 was illustrated in FIG. 12. However, if a sufficient function can be ensured, one or both of the dual O-rings 61a and 61b and 103 and 104 may be provided with only one O-ring not dual O-ring. In this case, one of the dual O-rings 61a and 61b and/or one of the dual O-rings 103 and 104 may remain as it is or one of the dual O-rings may be disposed at a place different from that shown in FIG. 12. The arrangement of the seal members may be variously changed depending on intended uses.

If the venting passage 97 is configured such that it is branched within and extends along the manifold 900 and branches of the venting passage join at one point outside the manifold 90, the differential pumping or purge gas supplying through the entire manifold 90 can be performed by connecting one vacuum means or one purge gas supplying means to the venting passage.

Additionally, a region of the venting passage 97 may be expanded to allow the differential pumping for an O-ring provided near a thermocouple to be collectively performed.

Meanwhile, a plurality of individual venting passages 97 may be formed to enable individual evacuation for the respective venting passages.

Moreover, one of the venting passages 97 may be used for an evacuation passage and one of the venting passages 97 may be used for supplying the purge gas to properly distinguish the uses from each other. Otherwise, the same venting passage 97 may be also utilized in a properly discrete manner depending on situations. For example, upon improvement of the permeability of the O-rings 61a, 61b, 103 and 104, the venting passage 97 is utilized as a nitrogen supplying passage to perform purging for sweeping oxygen.

Figure 13:
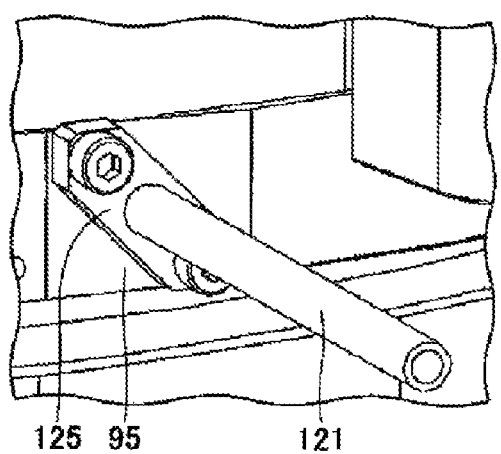
FIG. 13 is a view showing one example of a connection configuration of a gas pipe to a gas introduction part.

FIG. 13 is a view showing one example of a connection configuration of the gas pipe 121 to the gas introduction part 95. An elongated plate-shaped flange member 125 is formed integrally at the leading end of the gas pipe 121 by means of a fixing means such as welding. Both ends of the flange member 125 in a longitudinal direction (a direction from a left upper end to a right lower end in FIG. 13) are formed with threaded holes, and the gas pipe 121 is fixed to the manifold 90 by screws. A width of the flange member 125 is greater than a diameter of the gas pipe 121, wherein the width of the flange member 125 may be slightly greater than the diameter of the gas pipe 121 to such an extent that the flange member can fix the gasket 131 to achieve secure sealing. A longitudinal length of the flange member 125 is much greater than the width thereof. Since a clearance for preventing interference between a screw head and the gas pipe 121 should be provided, the length of the flange member may be dimensioned to have a value which is the sum of a diameter of the screw head and the clearance. Furthermore, chamfer-shaped slanted parts are formed at both ends of the flange member 125, and when the gas pipe 121 is fixed to the manifold 90, respective faces of the slanted part are parallel to the vertical and horizontal directions. With this configuration, the gas pipe 121 can be fixed in a required minimum space at the outer end surface of the manifold 90. Although FIG. 13 shows one example in which the flange member 125 is obliquely installed, the flange member may be installed in a vertical direction if the height of the manifold 90 is sufficiently high or the flange member may be horizontally installed if the height of the manifold 90 is small. Depending on the height of the manifold 90 or a pitch of the gas introducing passages 96, various types of flange members can be employed. As described above, the gas pipe 121 can be connected directly to the outer end of the gas introducing passage 96 of the gas introduction part 95, whereby it is possible to connect the gas pipe 121 directly to the gas introduction part 95 via a metal gasket or a resin seal material. With this, the gas pipe can be connected to the gas introducing passage 96 in a space-saving manner while securing sealability by means of the metal seal or the resin seal material.

Figure 14:
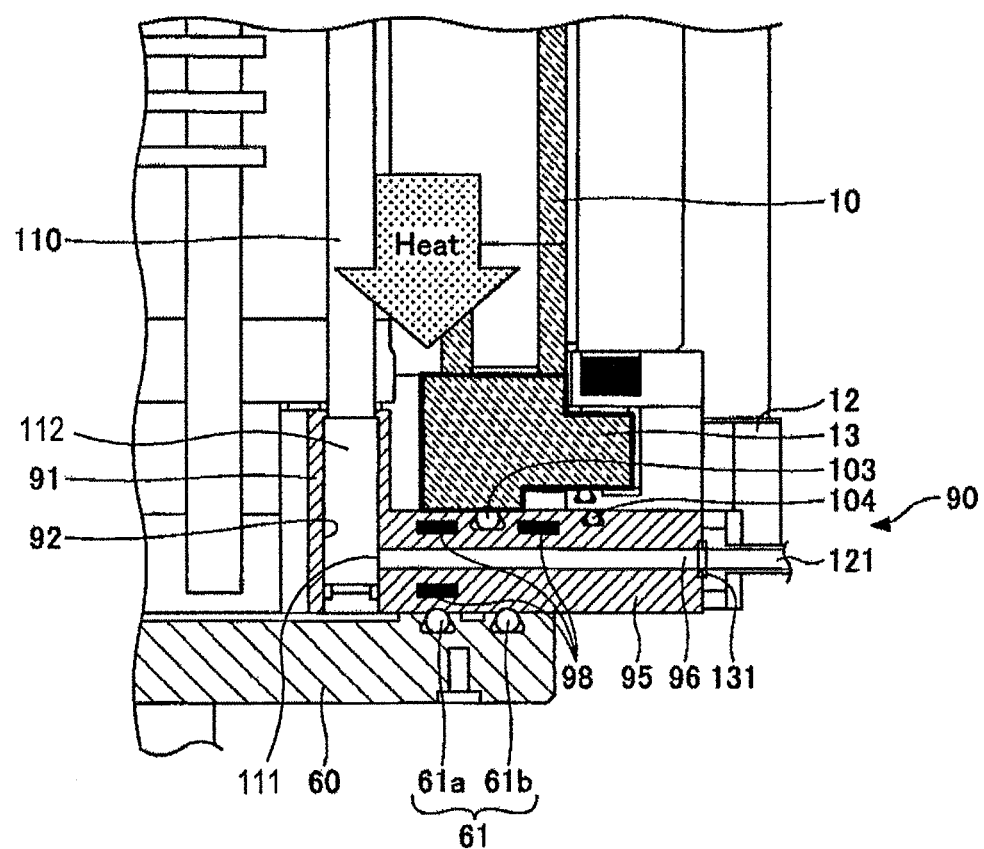
FIG. 14 is a view illustrating one example of an installation state of a cooling device of the processing apparatus according to the embodiment of the present disclosure.

FIG. 14 is a view illustrating one example of an installation state of a cooling device of the processing apparatus according to the embodiment of the present disclosure. In FIG. 14, water passages 98 are formed near the seal members 61a, 61b, 103 and 104 within the manifold 90. The seal members 61a, 61b, 103 and 104 can be cooled by causing a coolant such as cooling water to flow in the water passages 98.

Additionally, it is possible to cause a warm medium to flow in the water passages 98, so that if the water passages 98 are formed only near the gas introduction part 95, the gas introduction part 95 can be adjusted to have any temperature.

Furthermore, air or nitrogen gas may flow in the water passages 98 to perform air cooling.

As such, various types of venting passages 97 and water passages 98 may be formed in other regions of the manifold 90 so far as it is possible to secure the gas introducing passage 96 in communication with the insertion hole 92 or 92a of the injector supporting part 91, thereby coping with a variety of processes.

Figure 15A:
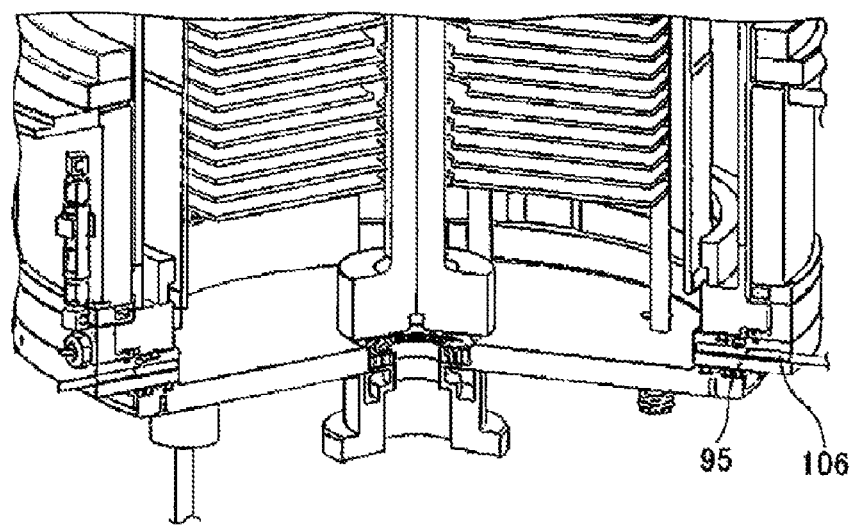
Figure 15B:
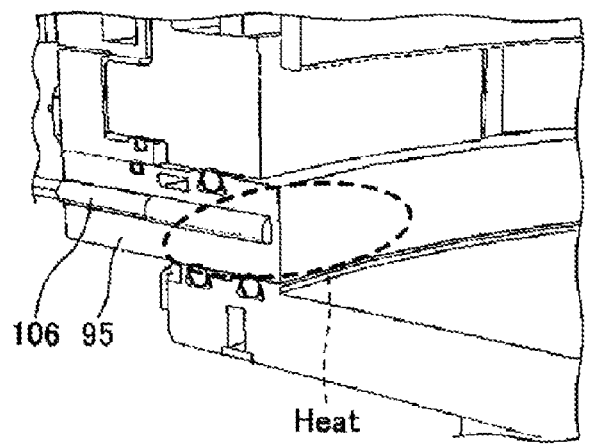

FIGS. 15a and 15B are views illustrating one example of an installation state of a heater at the gas introduction part 95 of the manifold 90 of the processing apparatus according to the embodiment of the present disclosure. FIG. 15A is an overall perspective view of one example of the installation state of the heater at the gas introduction part 95 and FIG. 15B is a partial enlarged view of one example of the installation state of the heater at the gas introduction part 95.

As shown in FIGS. 15A and 15B, a heater 106 may be provided at a location where it does not interfere with the gas introducing passage 96 of the gas introduction part 95 of the manifold 90. The heater 106 may be installed on various regions of the gas introduction part 95. For example, the heater may be installed near the gas introducing passage 96, for example, at both sides of the gas introducing passage 96. With this, the gas introducing passage 96 is heated to enable heating of a gas introduced therethrough.

Moreover, various heating means may be employed as the heater 106. For example, a cartridge heater may be employed.

Additionally, without passing through the injector 110, i.e., at a place where the injector supporting part 91 is not installed, an opening may be formed in an inner side of the processing container 10 to directly supply a gas from the gas introducing passage 96 toward the center of the interior of the processing container 10.

As such, with the processing apparatus according to the embodiment of the present disclosure, it is possible to install a number of injectors while constructing the gas introduction part 95 of the manifold 90 to be thinner. In addition, since various flow passages can be formed in the manifold 90, it is possible to perform compliant processing in accordance with applications.

According to the present disclosure in some embodiments, it is possible to reduce a pitch between injectors, thereby increasing the number of the injectors that can be installed in the same space.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A processing apparatus, comprising;
   a processing container;
   a manifold having an injector supporting part, the injector supporting part being disposed at a lower end of the processing container, extending along a wall surface in a vertical direction inside the processing container and having an insertion hole into which a tubular member can be inserted and by which the tubular member can be supported, and a gas introduction part extending radially outward from the injector supporting part, being exposed in an outside of the processing container and having a gas flow passage that horizontally extends within the gas introduction part, the gas flow passage having an inner end communicating with the insertion hole and an outer end communicating with the outside of the processing container;

an injector as the tubular member that is inserted and fixed into the insertion hole, the injector having a linear rod shape that entirely extends in a linear manner along the wall surface and having an opening that is formed in a side surface of the injector, the opening configured to contact with the inner end of the gas flow passage when the injector is inserted into the insertion hole so that the injector communicates with the gas flow passage; and a gas supplying pipe communicating with and connected to the outer end of the gas flow passage of the gas introduction part such that a gas is allowed to be supplied from the outside of the processing container into the processing container through the gas flow passage and the injector.

2. The processing apparatus of claim 1, wherein the gas introduction part of the manifold has a thickness smaller than a height of the injector supporting part.

3. The processing apparatus of claim 1, wherein the processing container and the injector are made of quartz and the manifold is made of a metal.

4. The processing apparatus of claim 1, wherein the injector supporting part has a bottom portion configured to close a lower end of the insertion hole, the injector has a thick portion formed at a lower end of the injector and having a diameter greater than that of the injector, a lower end surface of the injector is supported by the bottom portion, and a fixing member configured to fix the thick portion of the injector is installed at an upper portion of the insertion hole.

5. The processing apparatus of claim 1, wherein the insertion hole of the injector supporting part is a through hole, the injector has a thick portion formed at a lower end of the injector and having a diameter greater than that of the injector, a catching portion allowing the thick portion of the injector to be caught and to be fixed by the catching portion is installed at an upper portion of the insertion hole, and a disc member configured to support and fix the thick portion of the injector is installed at a lower portion of the insertion hole.

6. The processing apparatus of claim 4, wherein an elastic member configured to elastically support the injector is installed at least above or below the thick portion.

7. The processing apparatus of claim 1, wherein the injector and the insertion hole of the injector supporting part have catching structures configured to be engaged with each other so as to prevent a rotation of the injector.

8. The processing apparatus of claim 1, wherein the gas supplying pipe is connected to the gas introduction part of the manifold via a gasket.

9. The processing apparatus of claim 1, wherein the manifold is provided by extending the injector supporting part and the gas introduction part by a predetermined length along the wall surface of the processing container, and a plurality of insertion holes and a plurality of gas flow passages are formed along the wall surface within the predetermined length.

10. The processing apparatus of claim 9,
wherein the manifold is constructed such that the injector supporting part is not formed in a region other than the predetermined length along the wall surface of the processing container,
wherein the manifold has a frame-shaped part having no gas flow passage formed therein, and
wherein the gas introduction part and the frame-shaped part are formed into a shape that is conforming to the lower end of the processing container.

11. The processing apparatus of claim 10, wherein the processing container has a cylindrical shape, and the frame-shaped part and the gas introduction part form a ring shape as a whole.

12. The processing apparatus of claim 11, wherein the gas introduction part and the frame-shaped part of the manifold are disposed in an up and down direction between the lower end of the processing container and a lid functioning as a bottom surface of the processing container when processing is carried out, and seal members are installed between an upper surface of the manifold and the lower end of the processing container and between a lower surface of the manifold and the lid.

13. The processing apparatus of claim 12, wherein the seal members are dual O-rings installed in a form of concentric circles, a cut-away portion is formed in at least one of contact surfaces of the lower end of the processing container and the manifold and one of contact surfaces of the lid and the manifold between the dual O-rings, and the manifold has a venting passage formed therein to communicate with the cut-away portion and an outside of the manifold.

14. The processing apparatus of claim 13, wherein an evacuation unit is connected to at least a portion of an outer end of the venting passage and the cut-away portion is configured to enable differential pumping to be performed.

15. The processing apparatus of claim 13, wherein a purge gas supplying unit is connected to at least a portion of an outer end of the venting passage and the cut-away portion is configured to enable purging to be performed.

16. The processing apparatus of claim 10, wherein the manifold has a coolant flow passage formed therein.

17. The processing apparatus of claim 10, wherein the manifold has a heater embedded therein.

18. The processing apparatus of claim 1, wherein a heating unit is provided outside the processing container, and a substrate can be accommodated and heat-treated within the processing container.

* * * * *